(12) United States Patent
Gotti et al.

(10) Patent No.: US 10,290,800 B2
(45) Date of Patent: *May 14, 2019

(54) MEMORY CELLS HAVING A NUMBER OF CONDUCTIVE DIFFUSION BARRIER MATERIALS AND MANUFACTURING METHODS

(71) Applicant: Micron Technology, Inc., Boise, ID (US)

(72) Inventors: Andrea Gotti, Vaprio d'Adda (IT); F. Daniel Gealy, Kuna, ID (US); Davide Colombo, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/635,945

(22) Filed: Jun. 28, 2017

(65) Prior Publication Data

US 2017/0301858 A1    Oct. 19, 2017

Related U.S. Application Data

(60) Continuation of application No. 14/824,128, filed on Aug. 12, 2015, now Pat. No. 9,711,717, which is a division of application No. 13/952,162, filed on Jul. 26, 2013, now Pat. No. 9,130,157.

(51) Int. Cl.
*H01L 45/00* (2006.01)
*H01L 27/24* (2006.01)

(52) U.S. Cl.
CPC .......... *H01L 45/12* (2013.01); *H01L 27/2427* (2013.01); *H01L 27/2463* (2013.01); *H01L 27/2481* (2013.01); *H01L 45/06* (2013.01); *H01L 45/1233* (2013.01); *H01L 45/1253* (2013.01); *H01L 45/141* (2013.01); *H01L 45/144* (2013.01); *H01L 45/1608* (2013.01); *H01L 45/143* (2013.01)

(58) Field of Classification Search
None
See application file for complete search history.

(56) References Cited

U.S. PATENT DOCUMENTS

| | | |
|---|---|---|
| 6,515,897 B1 | 2/2003 | Monsma et al. |
| 8,461,563 B2 | 6/2013 | Yasuda |
| 8,551,805 B2 | 10/2013 | Oh et al. |
| 8,569,730 B2 | 10/2013 | Xu et al. |
| 9,130,157 B2 * | 9/2015 | Gotti .................. H01L 45/12 |

(Continued)

*Primary Examiner* — Michelle Mandala
(74) *Attorney, Agent, or Firm* — Brooks, Cameron & Huebsch, PLLC (57) ABSTRACT

Memory cells having a select device material located between a first electrode and a second electrode, a memory element located between the second electrode and a third electrode, and a number of conductive diffusion barrier materials located between a first portion of the memory element and a second portion of the memory element. Memory cells having a select device comprising a select device material located between a first electrode and a second electrode, a memory element located between the second electrode and a third electrode, and a number of conductive diffusion barrier materials located between a first portion of the select device and a second portion of the select device. Manufacturing methods are also described.

21 Claims, 4 Drawing Sheets

(56) References Cited

U.S. PATENT DOCUMENTS

| | | |
|---|---|---|
| 9,711,717 B2 * | 7/2017 | Gotti .................. H01L 45/12 |
| 2004/0113137 A1 | 6/2004 | Lowrey |
| 2004/0159835 A1 | 8/2004 | Krieger et al. |
| 2006/0073655 A1 | 4/2006 | Dennison |
| 2010/0117041 A1 | 5/2010 | Hwang et al. |
| 2011/0155989 A1 | 6/2011 | Park et al. |

* cited by examiner

United States Patent US 10,290,800 B2

MEMORY CELLS HAVING A NUMBER OF CONDUCTIVE DIFFUSION BARRIER MATERIALS AND MANUFACTURING METHODS

PRIORITY INFORMATION

This application is a Continuation of U.S. application Ser. No. 14/824,128 filed Aug. 12, 2015, which is a Divisional of U.S. application Ser. No. 13/952,162 filed Jul. 26, 2013, now U.S. Pat. No. 9,130,157, the specifications of which are incorporated herein by reference.

TECHNICAL FIELD

The present disclosure relates generally to semiconductor memory apparatuses and methods, and more particularly to resistance variable memory cells having a number of conductive diffusion barrier materials and manufacturing methods.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others. Types of resistance variable memory include phase change random access memory (PCRAM) and resistive random access memory (RRAM), for instance.

Resistance variable memory devices, such as PCRAM devices, can include a resistance variable material, e.g., a phase change material, for instance, which can be programmed into different resistance states to store data. The particular data stored in a phase change memory cell can be read by sensing the cell's resistance e.g., by sensing current and/or voltage variations based on the resistance of the phase change material.

DETAILED DESCRIPTION

Memory cells having number of conductive diffusion barrier materials and methods of manufacturing the same are described herein. As an example, a memory cell can include a select device material located between a first electrode and a second electrode, a memory element located between the second electrode and a third electrode, and a number of conductive diffusion barrier materials located between a first portion of the memory element and a second portion of the memory element.

Memory cells, such as memory cells having a phase change material, can be utilized in applications where a voltage is applied to the memory cell. This application of voltage can lead to electromigration, e.g., during transition from an amorphous state to a crystalline state, of components of the phase change material. Due to this electromigration, the phase change material can segregate into insulating-type section and a conducting-type section prior to crystallization. This phase change material segregation can result in diffusion limited set state crystallization. Diffusion limited set state crystallization can undesirably result in a portion of the phase change material falling below a holding voltage or becoming too resistive such that the bit quenches without a full set into an intermediate resistance, non-crystalline state. Additionally, memory cells, such as memory cells having a phase change material, can be formed by a process that includes a hard mask deposition. Temperatures associated with the hard mask deposition can be greater than a crystallization temperature of the phase change material. As such, the hard mask deposition can crystallize a portion of the phase change material prior to cell definition. This crystallization can lead to phase segregation into grains larger than the dimension of the cell, resulting in non-homogenous memory cell composition across an array of memory cells.

As mentioned, embodiments of the present disclosure can provide memory cells having number of conductive diffusion barrier materials. The number of conductive diffusion barrier materials can act as a diffusion barrier to help prevent electromigration of components of a phase change material and/or modulate the grain size of the phase change material to provide a homogenous memory cell composition across an array of memory cells. As such, embodiments can provide improved memory cells and/or arrays as compared to other approaches, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "6" in FIG. 1, and a similar element may be referenced as 206 in FIG. 2. Also, as used herein, "a number of" a particular element and/or feature can refer to one or more of such elements and/or features.

Figure 1:
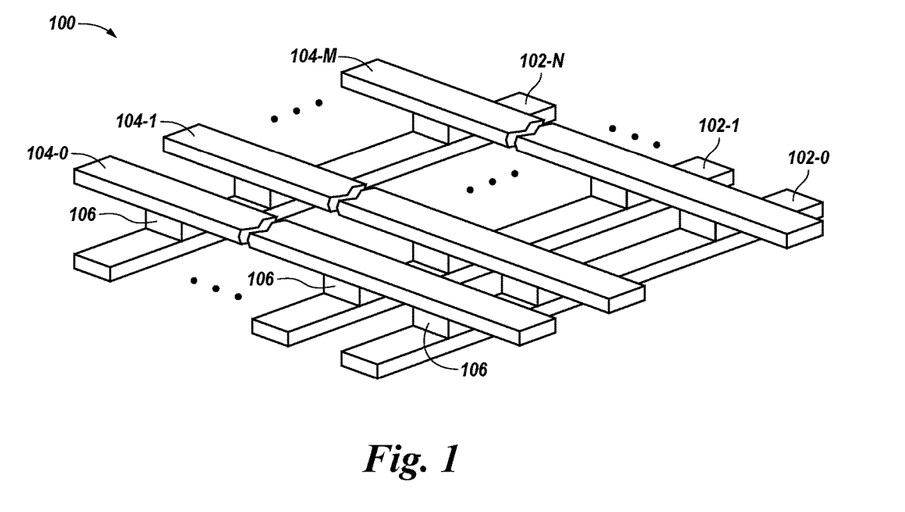
FIG. 1 is a block diagram of a portion of an array of memory cells 106 in accordance with a number of embodiments of the present disclosure.

FIG. 1 is a block diagram of a portion of an array 100 of memory cells 106 in accordance with a number of embodiments of the present disclosure. The array 100 can be a two terminal cross-point array having memory cells 106 located at the intersections of a first plurality of conductive lines, e.g., access lines, 102-0, 102-1, . . . 102-N, which may be referred to herein as word lines, and a second plurality of conductive lines, e.g., data/sense lines, 104-0, 104-1, . . . 104-M, which may be referred to herein as bit lines. The designators N and M can have various values. Embodiments are not limited to a particular number of word lines and/or bit lines. As illustrated, the word lines 102-0, 102-1, . . . 102-N are parallel to each other and are orthogonal to the bit lines 104-0, 104-1, . . . 104-M, which are substantially parallel to each other; however, embodiments are not so limited. The conductive lines can include conductive material, e.g., a metal material. Examples of the conductive material include, but are not limited to, tungsten, copper, titanium, aluminum, and/or combinations thereof, among other conductive materials.

Each memory cell 106 may include a memory element, e.g., a resistive memory element, coupled in series with a select device, e.g., an access device, in accordance with a number of embodiments described herein. The memory element and the select device are discussed further herein.

The select devices can be operated, e.g., turned on/off, to select/deselect the memory cells 106 in order to perform operations such as data programming, e.g., writing, and/or data sensing, e.g., reading operations. In operation, appropriate voltage and/or current signals, e.g., pulses, can be applied to the bit lines and word lines in order to program data to and/or read data from the memory cells 106. As an example, the data stored by a memory cell 106 of array 100 can be determined by turning on a select device and sensing a current through the memory element. The current sensed on the bit line corresponding to the memory cell 106 being read corresponds to a resistance level of the memory element, e.g., a resistance level of a resistance variable material, which in turn may correspond to a particular data state, e.g., a binary value. The array 100 can have an architecture other than that illustrated in FIG. 1, as will be understood by one of ordinary skill in the art.

The array 100 can be a two dimensional array. For example, the memory cells 106 of the array 100 can be arranged between the access lines, 102-0, 102-1, . . . 102-N and the data/sense lines, 104-0, 104-1, . . . 104-M in a single level. The array 100 can be a three dimensional array. For example, the memory cells of the array can be arranged in multiple levels, where each of the multiple levels has memory cells organized in a cross point architecture. For three dimensional array embodiments of the present disclosure, a vertical string of memory cells can be coupled to a data line and a plurality of access lines coupled to the vertical string of memory cells, for instance.

The access lines 102-0, 102-1, . . . 102-N and the data/sense lines 104-0, 104-1, . . . 104-M can be coupled to decoding circuits formed in a substrate material, e.g., formed adjacent to or for example below, the array 100 and used to interpret various signals, e.g., voltages and/or currents, on the access lines and/or the data/sense lines. As an example, the decoding circuits may include row decoding circuits for decoding signals on the access lines, and column decoding circuits for decoding signals on the data/sense lines.

As used in the present disclosure, the term substrate material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS), e.g., a CMOS front end with a metal backend, and/or other semiconductor structures and technologies. Various elements, e.g., transistors, and/or circuitry, such as decode circuitry for instance, associated with operating the array 100 can be formed in/on the substrate material such as via process steps to form regions or junctions in the base semiconductor structure or foundation.

The memory cells 106 can be formed using various processing techniques such as atomic material deposition (ALD), physical vapor deposition (PVD), chemical vapor deposition (CVD), supercritical fluid deposition (SFD), patterning, etching, filling, chemical mechanical planarization (CMP), combinations thereof, and/or other suitable processes. In accordance with a number of embodiments of the present disclosure, materials may be grown in situ.

Figure 2:
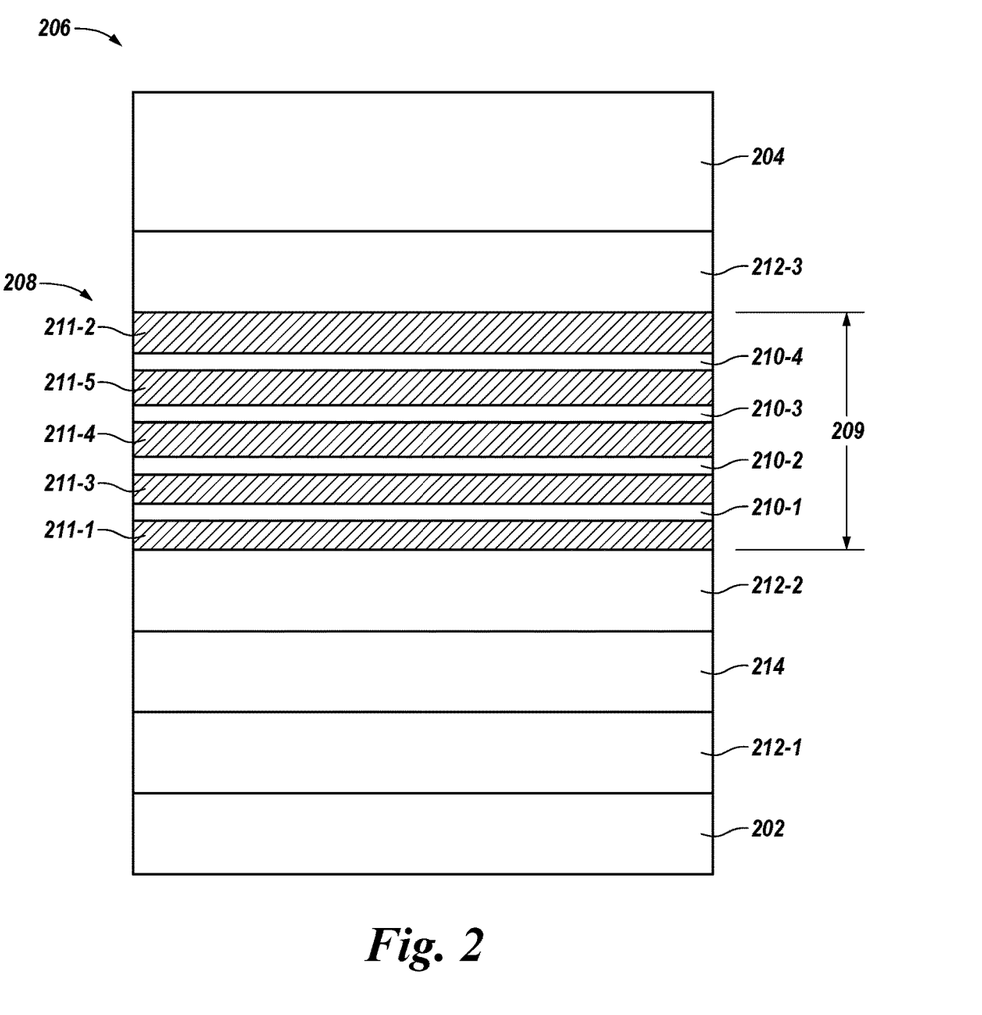
FIG. 2 illustrates a cross-sectional view of a memory cell in accordance with a number of embodiments of the present disclosure.

FIG. 2 illustrates a cross-sectional view of a memory cell 206 in accordance with a number of embodiments of the present disclosure. As mentioned the memory cell 206 can include a memory element 208. The memory element 208 can include a programmable portion that may have a variable resistance, for example. The memory element 208 can include, for example, one or more resistance variable materials. Embodiments provide that the memory element 208 can be formed on an electrode, e.g., the memory element can be formed by depositing sequential layers on the electrode. For example, the memory element 208 can be formed on electrode material 212-2, as discussed further herein, by physical vapor deposition.

The memory element 208 can include a resistance variable material, e.g., a phase change material. The resistance variable material can be a chalcogenide e.g., a Ge—Sb—Te material such as $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other resistance variable materials can include Ge—Te, In—Se, Sb—Te, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

The memory element 208 can have a thickness 209 of in a range from 10 nanometers to 35 nanometers. For example, the memory element 208 can have a thickness in a range from 12 nanometers to 30 nanometers, or in a range from 15 nanometers to 25 nanometers. For a number of embodiments, the memory element 208 can have a thickness 209 of 20 nanometers.

The memory element 208 can include a number of memory element portions 211-1, 211-2, 211-3, 211-4, 211-5. As illustrated in FIG. 2, the memory element 208 includes five portions; however, embodiments are not so limited. For example, the memory element 208 can include two, three, four, six, seven, or other numbers of memory element portions. According to a number of embodiments, the memory element portions can correspond to different layers of the memory element.

Embodiments provide that the memory element portions 211-1, 211-2, 211-3, 211-4, 211-5 can have the same composition; however, embodiments are not so limited. For example, each of the memory element portions can have a different composition. Also, for example, a number of the memory element portions can have a first composition while another number of the memory element portions have a second composition, such that the first composition is different than the second composition.

Each of the memory element portions 211-1, 211-2, 211-3, 211-4, 211-5 can have a thickness in a range from 1 nanometer to 10 nanometers. For example, the memory element portions can have a thickness in a range from 2 nanometers to 8 nanometers, or from 3 nanometers to 7 nanometers. For a number of embodiments, the memory element portions can have a thickness of 5 nanometers. Embodiments provide that the memory element portions can have the same thickness; however, embodiments are not so limited. For example, each of the memory element portions can have a different thickness. Also, for example, a number of the memory element portions can have a first thickness while another number of the memory element portions have a second thickness, such that the first thickness is different than the second thickness.

The memory cell 206 can include a number of conductive diffusion barrier materials 210-1, 210-2, 210-3, 210-4 located between a first portion 211-1 of the memory element 208 and a second portion 211-2 of the memory element 208. According to a number of embodiments, the conductive diffusion barrier materials can correspond to different layers of the memory element. The conductive diffusion barrier material 210 is conductive. The conductive diffusion barrier material 210 can include an inert material, such as carbon, carbon nitride or combinations thereof, among other inert materials. Embodiments provide that the conductive diffusion barrier materials 210 can have the same composition; however, embodiments are not so limited. For example, each of the conductive diffusion barrier materials can have a different composition. Also, for example, a number of the conductive diffusion barrier materials can have a first composition while another number of the conductive diffusion barrier materials have a second composition, such that the first composition is different than the second composition. As an example, the inert material can be non-reactive with a chalcogenide. The conductive diffusion barrier material 210 can help prevent electromigration of components of a phase change material, e.g., a phase change material comprised by a memory element as discussed herein, and/or modulate the grain size of a phase change material included in the memory element 208.

As illustrated in FIG. 2, there are four conductive diffusion barrier materials 210-1, 210-2, 210-3, 210-4 located between the portion 211-1 of memory element 208 and the portion 211-2 of memory element 208; however, embodiments are not so limited. For example, there may be one; two, three, five, or other numbers of conductive diffusion barrier materials 210 located between the portion 211-1 of memory element 208 and the portion 211-2 of memory element 208.

Each of the conductive diffusion barrier materials 210 can have a thickness in a range from 1 angstrom to 50 angstroms. For example, the conductive diffusion barrier material 210 can have a thickness in a range from 1 angstrom to 40 angstroms, from 1 angstrom to 30 angstroms, from 1 angstrom to 15 angstroms, or from 1 angstrom to 5 angstroms. For embodiments having a plurality of conductive diffusion barrier materials 210, the conductive diffusion barrier materials 210 can have the same thickness; however, embodiments are not so limited. For example, each of the conductive diffusion barrier materials 210 can have a different thickness. Also, for example, a number of the conductive diffusion barrier materials 210 can have a first thickness while another number of the conductive diffusion barrier materials 210 have a second thickness, such that the first thickness is different than the second thickness.

Each of the conductive diffusion barrier materials 210 is immediately located between different portions of the memory element 208. For example, the conductive diffusion barrier materials can be interleaved between respective memory element portions. In other words, each of the conductive diffusion barrier materials 210 is separated from another diffusion barrier material 210 by at least one portion of the memory element 208. For example, as illustrated in FIG. 2, the conductive diffusion barrier material 210-1 that contacts the portion 211-1 of memory element 208 is separated from the conductive diffusion barrier material 210-4 that contacts the portion 211-2 of memory element 208 by three portions 211-3, 211-4, 211-5 of memory element 208.

As mentioned, the memory element 208 can be formed on an electrode, e.g., electrode 212-2 discussed below. For example, a portion 211-1 of memory element 208 can be formed on electrode 212-2. Thereafter, a conductive diffusion barrier material 210-1 can be formed on the portion 211-1 of the memory element 208 and a portion 211-3 can be formed on the conductive diffusion barrier material 210-1. Similarly, additional portions of the memory element, e.g., portions 211-4, 211-5, 211-2, and additional conductive diffusion barrier materials, e.g., conductive diffusion barrier materials 210-2, 210-3, 210-4, can be formed. The memory element 208 can be formed by physical vapor deposition, for example.

As illustrated in FIG. 2, the memory cell 206 can include a number of electrodes, e.g., a first electrode 212-1, a second electrode 212-2, and a third electrode 212-3. Embodiments of the present disclosure provide that an electrode, e.g., electrode 212-1 can be coupled to, e.g., formed on, a conductive line, such as conductive line 202 shown in FIG. 2 or one of conductive lines 102-0 to 102-N shown in FIG. 1. Embodiments of the present disclosure provide that an electrode, e.g., electrode 212-3 can be coupled to a conductive line, such as conductive line 204 shown in FIG. 2 or one of conductive lines 104-0 to 104-M shown in FIG. 1. For example, conductive line 204 can be formed on electrode 212-3, which can be formed on the memory element 208. Embodiments of the present disclosure provide that an electrode, e.g., electrode 212-2 can be located between the memory element 208 and a select device 214. For example, electrode 212-2 can be formed on the select device 214 and the memory element 208 can be formed on the electrode 212-2. The electrodes can be formed by physical vapor deposition, for example.

Embodiments of the present disclosure provide that the conductive diffusion barrier materials 210 are parallel to an electrode, e.g., electrode 212-1, electrode 212-2, and/or third electrode 212-3. However, embodiments are not so limited.

The electrodes 212-1, 212-2, 212-3 can include an electrode material. Examples of the electrode material include, but are not limited to, Ti, Ta, W, Al, Cr, Zr, Nb, Mo, Hf, B, C, nitrides of the aforementioned materials, e.g., TiN, TaN, WN, CN, etc., and/or combinations thereof.

The memory cell 206 can include a select device 214. The select device 214 can be located between two electrodes, e.g., electrode 212-1 and electrode 212-2. For example, the select device 214 can be formed on electrode 212-1 and electrode 212-2 can be formed on the select device 214. As an example, the select device can be formed by depositing sequential layers on the electrode. The select device can be formed by physical vapor deposition, for example.

In a number of embodiments, the select device 214 can be a two-terminal ovonic threshold switch (OTS), for instance. An OTS can include, for example, a chalcogenide material, as discussed herein, formed between a pair of conductive materials, e.g., electrodes 212-1, 212-2. Responsive to an applied voltage across the OTS that is less than a threshold voltage, the OTS can remain in an "off" state, e.g., an electrically nonconductive state. Alternatively, responsive to an applied voltage across the OTS that is greater than the threshold voltage, the OTS can snapback to an "on" state. In the "on" state the OTS can carry substantial current with a voltage at its terminals remaining almost constant to a holding voltage level.

Figure 3:
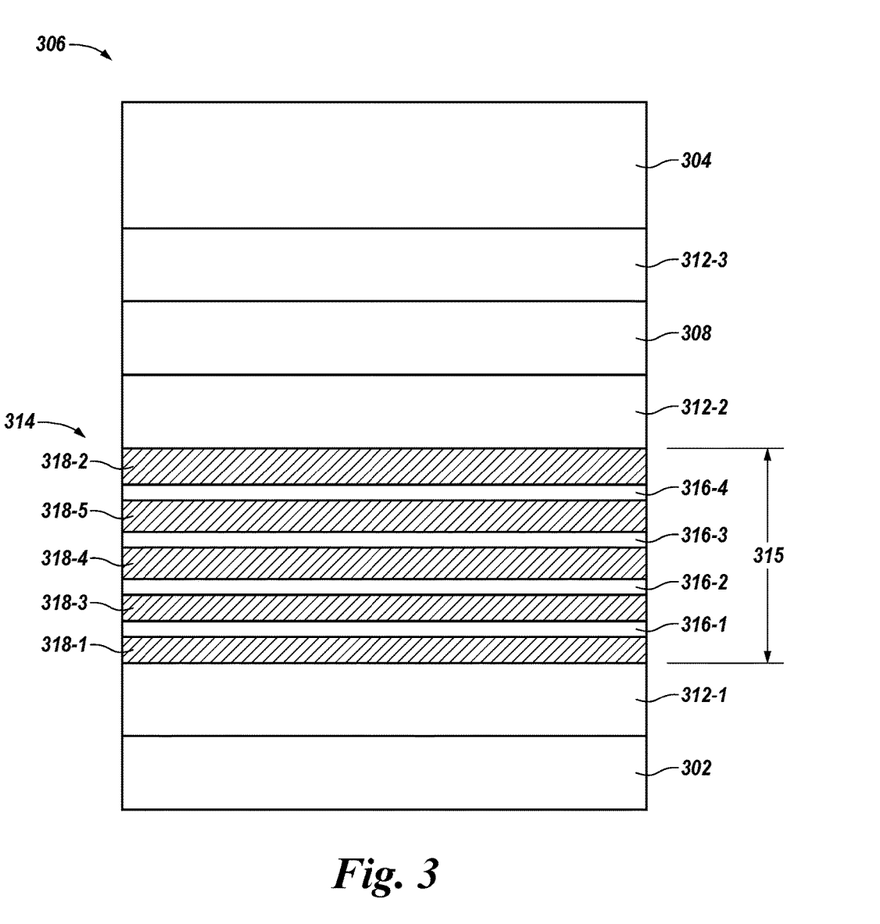
FIG. 3 illustrates a cross-sectional view of a memory cell in accordance with a number of embodiments of the present disclosure.

FIG. 3 illustrates a cross-sectional view of a memory cell 306 in accordance with a number of embodiments of the present disclosure. The memory cell can include a select device 314. The select device can comprise a select device material. The select device can comprise a chalcogenide, e.g., a Ge—Sb—Te material such as $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other resistance variable materials, which the select device 314 can comprise, include Ge—Te, In—Se, Sb—Te, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

Embodiments provide that the select device portions can have the same composition; however, embodiments are not so limited. For example, each of the select device portions can have a different composition. Also, for example, a number of the select device portions can have a first composition while another number of the select device portions have a second composition, such that the first composition is different than the second composition.

The select device 314 can have a thickness 315 of in a range from 10 nanometers to 35 nanometers. For example, the select device 314 can have a thickness in a range from 12 nanometers to 30 nanometers, or in a range from 15 nanometers to 25 nanometers.

The select device 314 can include a number of select device portions 318-1, 318-2, 318-3, 318-4, 318-5. As illustrated in FIG. 3, the select device 314 includes five portions; however, embodiments are not so limited. For example, the select device 314 can include two, three, four, six, seven, or other numbers of memory element portions. According to a number of embodiments, select device portions can correspond to different layers of the memory element.

Each of the select device portions 318-1, 318-2, 318-3, 318-4, 318-5 can have a thickness in a range from 1 nanometer to 10 nanometers. For example, the select device portions can have a thickness in a range from 2 nanometers to 8 nanometers, or from 3 nanometers to 7 nanometers. For a number of embodiments, the select device portions can have a thickness of 5 nanometers. Embodiments provide that the select device portions can have the same thickness; however, embodiments are not so limited. For example, each of the select device portions can have a different thickness. Also, for example, a number of the select device portions can have a first thickness while another number of the select device portions have a second thickness, such that the first thickness is different than the second thickness.

Embodiments of the present disclosure provide that the memory cell 306 can include a number of conductive diffusion barrier materials 316-1, 316-2, 316-3, 316-4 located between a first portion 318-1 of the select device 314 and a second portion 318-2 of the select device 314. The conductive diffusion barrier material 316 can include an inert material, such as carbon or carbon nitride, among other inert materials. Embodiments provide that the conductive diffusion barrier materials 316 can have the same composition; however, embodiments are not so limited. For example, each of the conductive diffusion barrier materials can have a different composition. Also, for example, a number of the conductive diffusion barrier materials can have a first composition while another number of the conductive diffusion barrier materials have a second composition, such that the first composition is different than the second composition. The conductive diffusion barrier material 316 can help to prevent electromigration of components, e.g., a select device material, of the select device 314 and/or modulate the grain size of the phase change material. The number of conductive diffusion barrier materials can be formed by physical vapor deposition, for example.

As illustrated in FIG. 3, there are four conductive diffusion barrier materials 316-1, 316-2, 316-3, 316-4 located between the portion 318-1 of select device 314 and the portion 318-2 of select device 314; however, embodiments are not so limited. For example, there may be one; two, three, five, or other numbers of conductive diffusion barrier materials 316 located between the portion 318-1 of select device 314 and the portion 318-2 select device 314.

Each of the conductive diffusion barrier materials 316 can have a thickness in a range from 1 angstrom to 50 angstroms. For example, the conductive diffusion barrier material 316 can have a thickness in a range from 1 angstrom to 40 angstroms, from 1 angstrom to 30 angstroms, from 1 angstrom to 15 angstroms, or from 1 angstrom to 5 angstroms. For embodiments having a plurality of conductive diffusion barrier materials 316, the conductive diffusion barrier materials 316 can have the same thickness; however, embodiments are not so limited. For example, each of the conductive diffusion barrier materials 316 can have a different thickness. Also, for example, a number of the conductive diffusion barrier materials 316 can have a first thickness while another number of the conductive diffusion barrier materials 316 have a second thickness, such that the first thickness is different than the second thickness.

Each of the conductive diffusion barrier materials 316 is immediately located between different portions of the select device 314. For example, the conductive diffusion barrier materials can be interleaved between respective select device portions. In other words, each of the conductive diffusion barrier materials 316 is separated from another diffusion barrier material 316 by at least one portion of the select device 314. For example, as illustrated in FIG. 3, the conductive diffusion barrier material 316-1 that contacts the portion 318-1 of select device 314 is separated from the conductive diffusion barrier material 316-4 that contacts the portion 318-2 of select device 314 by three portions 318-3, 318-4, 318-5 of select device 314.

Embodiments of the present disclosure provide that the conductive diffusion barrier materials 316 are parallel to an electrode, e.g., electrode 312-1, electrode 312-2, and/or third electrode 312-3. However, embodiments are not so limited.

Figure 4:
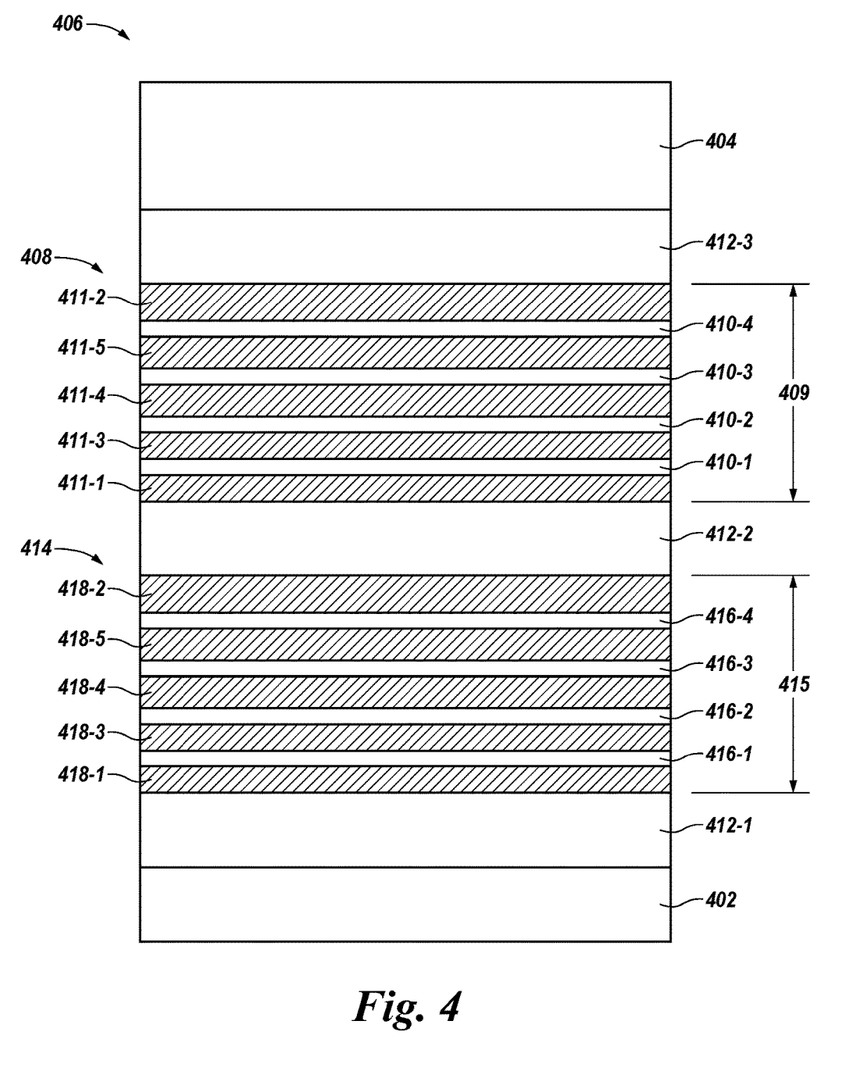
FIG. 4 illustrates a cross-sectional view of a memory cell in accordance with a number of embodiments of the present disclosure.

FIG. 4 illustrates a cross-sectional view of a memory cell 406 in accordance with a number of embodiments of the present disclosure. As illustrated in FIG. 4, embodiments of the present disclosure provide that a memory cell 406 can include a number of conductive diffusion barrier materials 410-1, 410-2, 410-3, 410-4 located between a first portion 411-1 of the memory element 408 and a second portion 411-2 of the memory element 408 and a number of conductive diffusion barrier materials 416-1, 416-2, 416-3, 416-4 located between a first portion 418-1 of the select device 414 and a second portion 418-2 of the select device 414.

Embodiments of the present disclosure provide that the memory cell can have a dimension, e.g., a diameter or a width, in range from 10 nanometers to 30 nanometers. For example, the memory cell can have a dimension in range from 15 nanometers to 25 nanometers. For a number of embodiments, the memory cell can have a dimension of 20 nanometers.

A number of embodiments provide that a memory cell having a dimension of a greater value, relative to a memory cell having a dimension of a lesser value, can include a greater number of conductive diffusion barrier materials located between a first portion of a memory element and a second portion of the memory element as compared to the memory cell having the dimension of a lesser value. For example, a memory cell having a diameter of 20 nanometers can include a greater number of conductive diffusion barrier materials, e.g., four conductive diffusion barrier materials, located between a first portion of a memory element and a second portion of the memory element as compared to a memory cell having a diameter of 15 nanometers, which can include three conductive diffusion barrier materials located between a first portion of a memory element and a second portion of the memory element. However, embodiments are not so limited.

A number of embodiments provide that a memory cell having a dimension of a greater value, relative to a memory cell having a dimension of a lesser value, can include a greater number of conductive diffusion barrier materials located between a first portion of a select device and a second portion of the select device as compared to the memory cell having the dimension of a lesser value. For example, a memory cell having a diameter of 20 nanometers can include a greater number of conductive diffusion barrier materials, e.g., four conductive diffusion barrier materials, located between a first portion of a memory element and a second portion of the select device as compared to a memory cell having a diameter of 15 nanometers, which can include three conductive diffusion barrier materials located between a first portion of a memory element and a second portion of the select device. However, embodiments are not so limited.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory cell, comprising:
   a programmable memory element located between a first electrode and a second electrode;
   wherein the programmable memory element comprises at least a first programmable memory element portion and a second programmable memory element portion; and
   a conductive diffusion barrier material located between the first programmable memory element portion and the second programmable memory element portion of the programmable memory element.

2. The memory cell of claim 1, wherein the first programmable memory element portion and the second programmable memory element portion each comprise a chalcogenide material.

3. The memory cell of claim 2, wherein the chalcogenide material is a resistance variable material.

4. The memory cell of claim 2, wherein the chalcogenide material is a phase change material.

5. The memory cell of claim 2, wherein a composition of the chalcogenide material of the first programmable memory element portion is different than a composition of the chalcogenide material of the second programmable memory element portion.

6. The memory cell of claim 1, wherein a thickness of the chalcogenide material of the first programmable memory element portion is different than a thickness of the chalcogenide material of the second programmable memory element portion.

7. The memory cell of claim 1, wherein a thickness of the chalcogenide material of the first programmable memory element portion and a thickness of the chalcogenide material of the second programmable memory element portion is not greater than 10 nanometers.

8. The memory cell of claim 1, wherein the programmable memory element comprises:
   at least a third programmable memory element portion; and
   a conductive diffusion barrier material located between the second programmable memory element portion and the third programmable memory element portion of the programmable memory element.

9. The memory cell of claim 8, wherein a thickness of the conductive diffusion barrier material located between the second programmable memory element portion and the third programmable memory element portion and a thickness of the conductive diffusion barrier material located between the first programmable memory element portion and the second programmable memory element portion is not greater than 50 angstroms.

10. The memory cell of claim 8, wherein the conductive diffusion barrier material located between the second programmable memory element portion and the third programmable memory element portion and the conductive diffusion barrier material located between the first programmable memory element portion and the second programmable memory element portion have different thicknesses.

11. The memory cell of claim 8, wherein the conductive diffusion barrier material located between the second programmable memory element portion and the third programmable memory element portion and the conductive diffusion barrier material located between the first programmable memory element portion and the second programmable memory element portion have different compositions.

12. The memory cell of claim 11, wherein the conductive diffusion barrier material located between the second programmable memory element portion and the third programmable memory element portion and the conductive diffusion barrier material located between the first programmable memory element portion and the second programmable memory element portion comprise at least one of carbon and carbon nitride.

13. The memory cell of claim 1, further comprising a select device material located between the second electrode and a third electrode.

14. The memory cell of claim 13, wherein the select device material comprises a first portion and a second portion, and wherein a conductive diffusion barrier material is located between the first portion and the second portion.

15. The memory cell of claim 13, wherein the select device material comprises a chalcogenide material.

16. The memory cell of claim 15, wherein a composition of the select device material is different than a composition of the programmable memory element portions.

17. A method of forming a memory cell, comprising:
forming a programmable memory element located between a first electrode and a second electrode;
wherein forming the programmable memory element comprises forming at least a first programmable memory element portion and a second programmable memory element portion; and
forming a conductive diffusion barrier material located between the first programmable memory element portion and the second programmable memory element portion of the programmable memory element.

18. The method of claim 17, wherein the first programmable memory element portion and the second programmable memory element portion each comprise a chalcogenide material.

19. The method of claim 17, wherein forming the programmable memory element comprises:
forming at least a third programmable memory element portion; and
forming a conductive diffusion barrier material located between the second programmable memory element portion and the third programmable memory element portion of the programmable memory element.

20. The method of claim 17, wherein the method includes forming a select device material between the second electrode and a third electrode.

21. A memory cell, comprising:
a programmable memory element located between a first electrode and a second electrode;
wherein the programmable memory element comprises at least two programmable chalcogenide portions; and
wherein a conductive diffusion barrier material is interleaved with the at least two programmable chalcogenide portions such that each of the conductive diffusion barrier materials is separated by at least one programmable chalcogenide portion.

* * * * *